United States Patent [19] [11] 3,715,690
Young et al. [45] Feb. 6, 1973

[54] AUTOMATIC TUNING ELECTRIC WAVE FILTER

[75] Inventors: Robert W. Young, Erial; Frederick J. Radler, Mt. Royal, both of N.J.

[73] Assignee: TRW Inc., Euclid, Ohio

[22] Filed: May 18, 1971

[21] Appl. No.: 144,100

[52] U.S. Cl. ..................333/17, 325/471, 333/73 W, 333/83 R, 334/20
[51] Int. Cl. ............................H03h 7/10, H03g 5/24
[58] Field of Search .............333/17, 70, 73 W, 83 R; 334/20, 22, 26, 79; 325/174, 462, 471

[56] References Cited

UNITED STATES PATENTS

| | | | |
|---|---|---|---|
| 3,293,572 | 12/1966 | Smith | 333/17 |
| 3,537,045 | 10/1970 | Ono | 334/79 X |
| 2,160,088 | 5/1939 | Runge | 333/17 |
| 3,475,702 | 10/1969 | Ainsworth | 333/17 |
| 2,518,092 | 8/1950 | Sunstein et al. | 333/73 W |
| 3,355,667 | 11/1967 | Bruene | 333/17 X |

*Primary Examiner*—Paul L. Gensler
*Attorney*—Smith, Harding, Earley & Follmer

[57] ABSTRACT

A band pass filter for use in RF transmitting or receiving apparatus comprises a plurality of resonant stages coupled through variable apertures whose areas are dependent on the tuning adjustment of the resonant stages whereby a substantially constant bandwidth and insertion loss are achieved over the tuning range. Tuning is effected by a servomechanism responsive to the conditions of phase and signal level at the input and output ports of the filter. The phase and signal level are sensed through directional couplers at the input and output ports of the filter. The couplers at the filter input and output act as matching sections, thereby minimizing losses.

14 Claims, 9 Drawing Figures

INVENTORS
ROBERT W. YOUNG &
FREDERICK J. RADLER
BY
Smith Harding Earley & Follmer
ATTORNEYS INVENTORS
ROBERT W. YOUNG &
FREDERICK J. RADLER
BY
Smith Harding Earley & Follmer
ATTORNEYS INVENTORS
ROBERT W. YOUNG &
FREDERICK J. RADLER
BY
Smith Harding Earley & Follmer
ATTORNEYS INVENTORS
ROBERT W. YOUNG &
FREDERICK J. RADLER
BY
Smith, Harding, Earley & Follmer
ATTORNEYS

AUTOMATIC TUNING ELECTRIC WAVE FILTER

BRIEF SUMMARY OF THE INVENTION

This invention relates to filters, and particularly to an automatic tuning electric wave filter for use in communications equipment and the like.

In modern communications systems, particularly in VHF and UHF aircraft communications systems, broad-band solid state RF amplifiers are gaining popularity principally because they eliminate much of the effort involved in tuning the various stages of conventional communications apparatus, particularly transmitters.

A transmitter of the type here involved typically consists of a digital frequency synthesizer followed by intermediate and final power amplifiers, both of the solid state, broad-band type. The operator can rapidly select the desired transmitting frequency by manipulating the control of the synthesizer, and need not make any adjustments to the intermediate and final amplification stages.

The principal problem in the use of transmitting systems of this kind is the emanation of broad band noise radiations from the intermediate and final amplification stages. Since the amplifiers are of the broad band type, any noise generated in an amplifier or in a preceding stage is passed on to and amplified by the next stage, and ultimately radiated by the antenna.

The principal object of this invention is to reduce broad band noise radiations while still avoiding the necessity for manual tuning of amplifier stages. This object is accomplished by providing a filter which may be inserted in the output of one or more of the amplification stages of a transmitter, and which automatically tunes itself to the frequency of the applied signal whereby the applied signal is passed with little attenuation while the undesired parts of the frequency spectrum including the above-mentioned noise are reduced to low levels.

Various schemes for the automatic tuning of a resonant circuit to the frequency of the applied signal are known. For example, it is known to produce a reference voltage corresponding to the frequency of an applied signal and to compare that reference voltage with a voltage delivered by a potentiometer driven by a tuning shaft, stopping the tuning shaft when the two voltages are equal. It is also known to position a tuning shaft by providing a separate oscillator the frequency of which is controlled by the shaft and to compare the oscillator frequency to the frequency of a fixed crystal oscillator, and to use a phase locked looped to position the shaft and to phase lock the tunable oscillator to the crystal oscillator. Neither of these known schemes is entirely satisfactory for automatically tuning a narrow band band-pass filter. In the former, calibration is necessary but is very difficult to achieve. In the latter, positioning of the tuning shaft is limited to discrete points established by crystal oscillators.

In accordance with this invention, very accurate positioning of the filter tuning shaft is achieved by the use of a servomechanism which is responsive to the phase shift across the filter. The servomechanism requires no calibration. The filter is continuously tunable; i.e., it will lock up on any signal frequency within the tuning range. Phase shift of a multiple-pole filter usually cannot be used by itself to effect control of the filter tuning shaft since, for a given applied signal, there may be several other points in the tuning range, apart from the resonant point, in which the detected phase shift will be the same as at resonance. Accordingly, logic circuitry is provided to effect coarse tuning of the filter until the center frequency of the pass-band is very near the applied signal, whereupon control is taken over by the phase detection circuit. Coarse tuning is achieved by taking into account both reflected power and transmitted power. In this way, false indications of an approach to a tuned condition which might result from power level changes are avoided.

One of the problems with tunable filters in communications systems is that the width of the pass band tends to increase as the filter is tuned to a higher center frequency $f_o$, whereas it is usually desirable to maintain a constant bandwidth having the minimum width capable of accommodating the kind of information being transmitted. A related problem is that the insertion loss $I_L$ pertaining to a tunable filter tends to increase as the filter is tuned to a lower center frequency. A further object of this invention is to maintain a substantially constant bandwidth and insertion loss across the tuning range in a tunable filter. Briefly, this object is achieved by providing variable aperture couplings between filter stages with the aperture dependent on the tuning of the filter so that the inter-stage coupling decreases as the center frequency increases.

Further objects of the invention are to provide maximum stop-band attenuation, and to minimize losses. Other objects will be apparent from the following descriptions when read in conjunction with the drawings.

DETAILED DESCRIPTION

Figure 1:
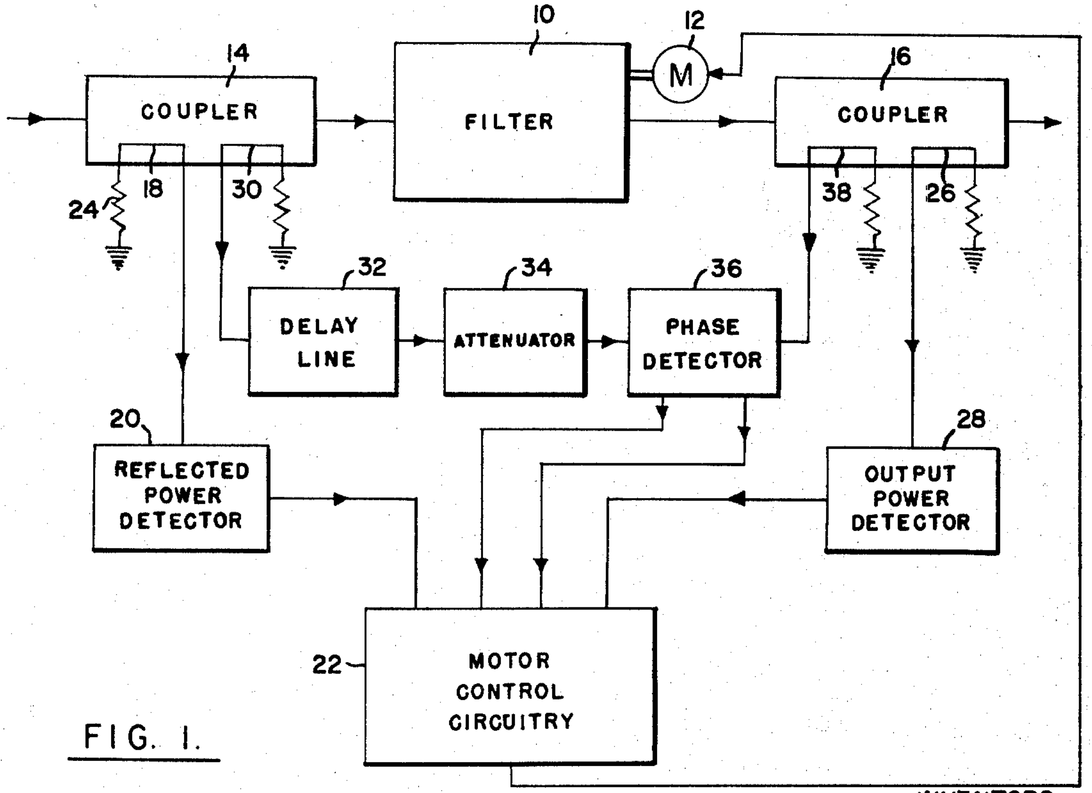
FIG. 1 is a block diagram of the electric wave filter in accordance with the invention along with the associated tuning control apparatus.

FIG. 1 shows, in block form, overall self-tuning filter system in accordance with the invention. This system is adapted to be used in radio frequency communications equipment, and it is particularly suited for use in transmitters utilizing digital synthesizers and broad-band power amplifiers. A filter may be placed between the intermediate and final power amplifiers of a transmitter, or it may be placed in the antenna circuit or at both locations.

The filter system comprises a tunable filter 10, the tuning of which is controlled by servomotor 12. Signals for the automatic control of motor 12 are derived through directional couplers 14 and 16 in the input and output circuits of filter 10. Coupling element 18 of directional coupling 14 is arranged to provide an output signal the magnitude of which varies directly with power reflected by filter 10, that is, the magnitude of the output signal increases with increasing reflected power. This signal is delivered to a detector 20 the output of which is delivered to motor control circuitry 22. A 50 ohm resistor 24 provides a termination for coupling element 18. Coupling element 26, in directional coupler 16, is arranged to provide a signal the magnitude of which varies directly with power transmitted through the filter. That signal is delivered to detector 28 which produces another output signal delivered to motor control circuitry 22. Coupling element 30 in directional coupler 14 picks up a signal corresponding to the signal at the input of filter 10. This signal is delayed by delay line 32, attenuated by attenuator 34, and compared in phase detector 36 with a signal derived through coupling element 38 which corresponds to the signal at the output of filter 10.

Briefly, the apparatus shown in FIG. 1 automatically tunes the filter so that the center frequency of its pass-band corresponds very closely to the frequency of the signal at its input. Tuning motor 12 normally operates continuously in one direction. When a signal is applied to the filter input, the simultaneous existence of a low reflected power level and a high output power level is sensed in motor control circuitry 22. These conditions indicate to the motor control circuitry that the center frequency of the pass-band is near the input frequency, and the control of the motor is then taken over by phase detector 36. The motor control circuitry causes the motor to hunt back and forth and to come to a stop with the phase detector output very close to a reference level indicating that the applied signal is in the center of the filter pass band.

The phase shift across the filter at resonance varies to some extent over the entire tuning range, but delay line 32 compensates for this variation. By comparing the phase shift across the filter with the phase shift in the delay line, the apparatus permits a very accurate adjustment of the center frequency of the pass band to correspond to the frequency of the applied signal. Phase shift cannot be used by itself to effect control of the tuning shaft since, for a given applied signal, there may be several other points in the tuning range in which the phase shift is the same as the phase shift at resonance. This is the principal reason for controlling tuning initially in response to forward and reflected power.

Filter 10 is a band-pass filter comprising a series of resonant stages preferably in the form of cavities interconnected through apertures. The filter will be best understood from reference to FIG. 4 in which filter 10 is shown as comprising three resonant cavities: input cavity 40, intermediate cavity 42, and output cavity 44. Within cavity 40 there is located an inductor or "helical resonator" 46 loaded by variable capacitor 48. The inductor and capacitor are connected in parallel, with one end of the parallel combination grounded. Cavity 42 contains a similarly arranged parallel combination comprising inductor 50 and variable capacitor 52; cavity 44 contains a similarly arranged parallel combination comprising inductor 54 and variable capacitor 56. Variable capacitors 48, 52 and 56 are ganged together on a common shaft.

The input to the filter is delivered to cavity 40 by means of loop 58, and the filter output is derived from cavity 44 by means of loop 60. Cavity 40 is coupled to cavity 42 through an aperture indicated at 62, and cavity 42 is similarly connected to cavity 44 through aperture 64. These apertures are respectively adjusted by means of doors 66 and 68 which are ganged together with the variable capacitors.

Figure 4:
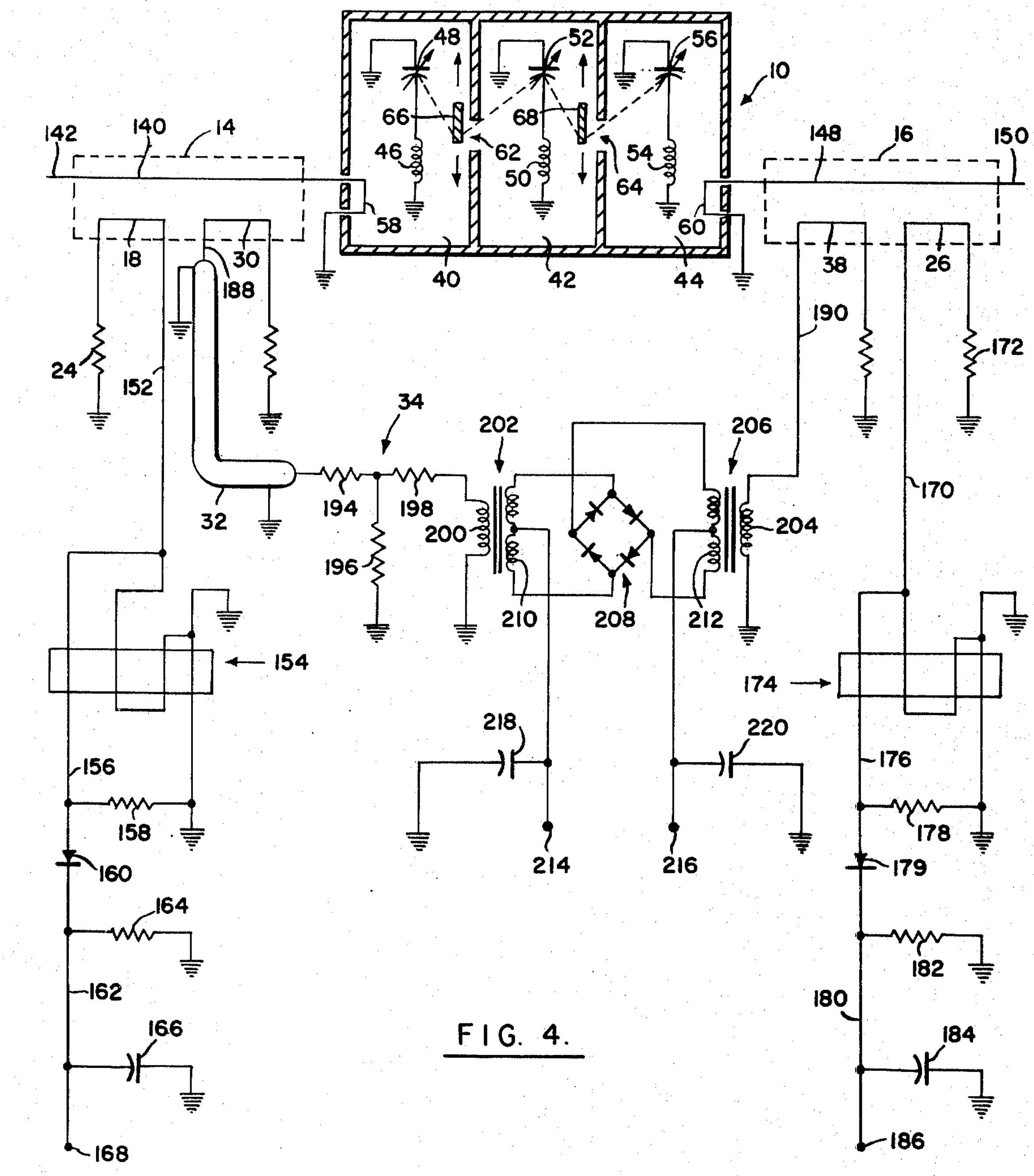
FIG. 4 is a schematic diagram of the filter and its associated circuitry providing control signals for operating the tuning servomechanism.
Figure 6:
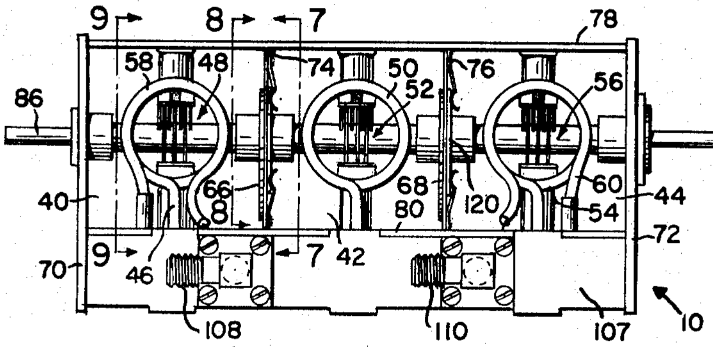
FIG. 6 is an elevation of a three-stage filter assembly in accordance with the invention with a front cover removed to show the interiors of its three resonant stages.
Figure 7:
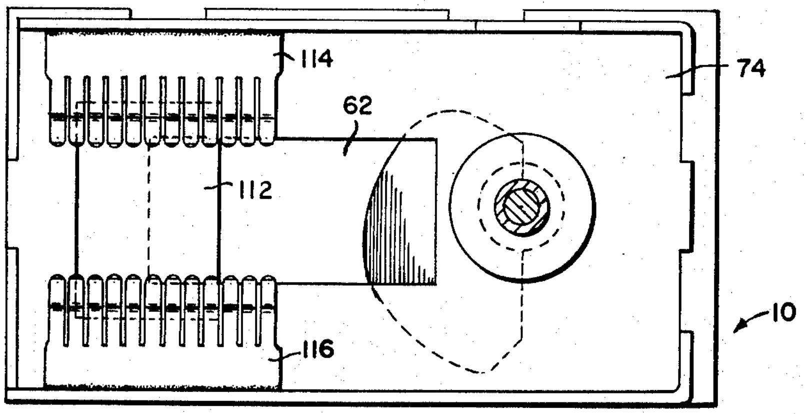
FIG. 7 is a vertical section taken on the plane 7—7 of FIG. 6.
Figure 8:
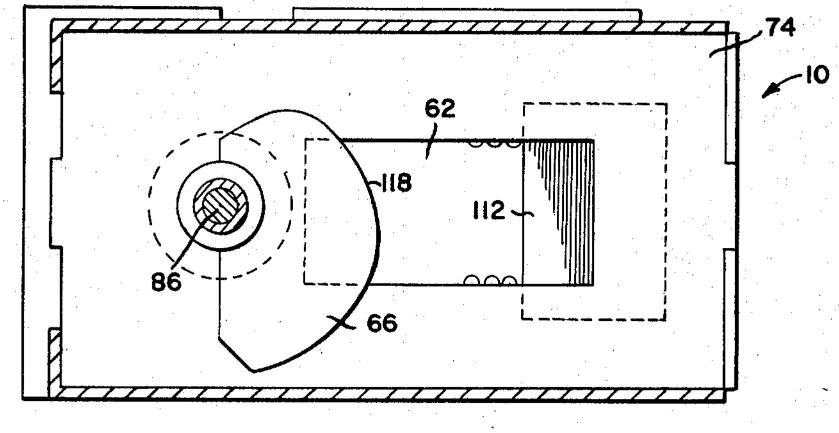
FIG. 8 is a vertical section taken on the plane 8—8 of FIG. 6.
Figure 9:
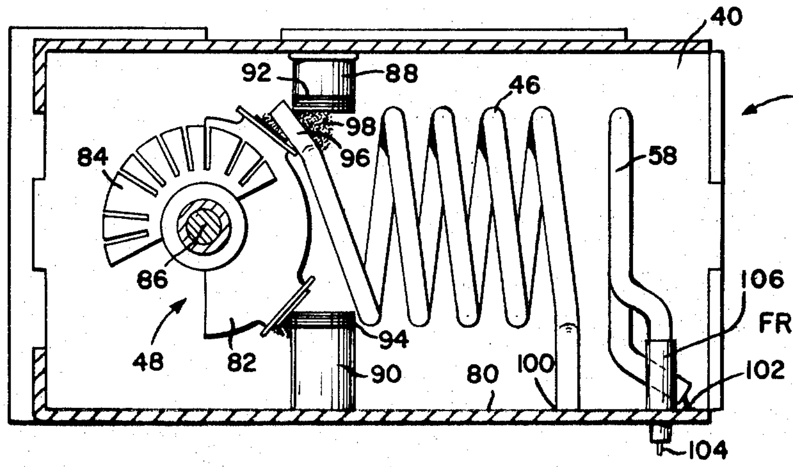
FIG. 9 is a vertical section taken on the plane 9—9 of FIG. 6.

While FIG. 4 shows the filter construction diagrammatically, the mechanical construction of the filter appears in FIGS. 6, 7, 8 and 9. FIG. 6 shows end covers 70 and 72 which form part of the filter housing. These end covers, along with barriers 74 and 76, cover plate 78, floor 80, and front and rear walls (not shown), define resonant cavities 40, 42 and 44. In cavity 40, input coupling loop 58 is shown along with inductor 46 and variable capacitor 48, the same being shown from the side in FIG. 9. In FIG. 9, capacitor 48 is shown as comprising a stator 82 and a rotor 84 mounted on and grounded to the metal chassis through shaft 86. Stator 82 is mounted between insulators 88 and 90 respectively having metal parts 92 and 94 to which the stator is soldered. End 96 of inductor 46 is soldered at 98 to metal part 92 and to stator 82. The other end of the inductor is grounded to metal floor 80 at 100.

The rotor plates of the variable capacitors are shaped in the conventional manner so as to provide a substantially linear relationship between the center frequency of the pass band and the angular displacement of shaft 86. This is accomplished by providing the rotor plates with a continuously decreasing radius in the clockwise direction as shown in FIG. 9. This linear relationship improves the uniformity of the performance of the motor and its control circuitry over the tuning range.

Figure 3:
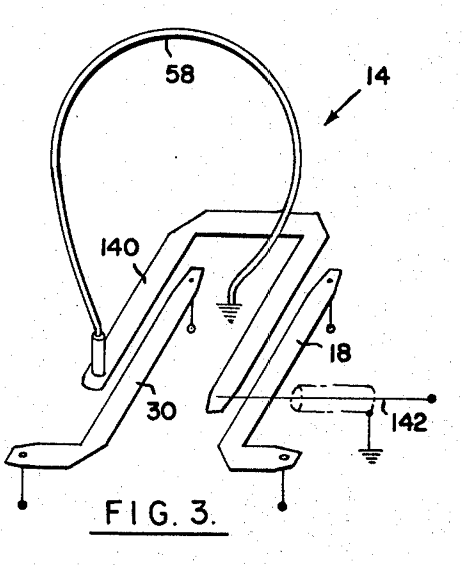
FIG. 3 is a perspective view of a strip coupling at the input of the filter.

Input loop 58 is insulated. One end of the conductive element thereof is grounded to the floor 80 at 102. The other end 104 extends downwardly through sleeve 106 and through floor 80 for connection to coupler 14 (FIG. 3).

All three cavities are similar with respect to the arrangement of inductors and capacitors. Output loop 60 is shown in FIG. 6. All three variable capacitors are mounted on common shaft 86, the rotors being grounded through the shaft.

Beneath floor 80 and behind cover plate 107 in FIG. 6, are located the directional couplers and the remaining circuitry shown in FIG. 4. Directional coupler 14 receives its input through coaxial connector 108, and directional coupler 16 delivers its output through coaxial connector 110.

The coupling apertures between the adjacent cavities are in barriers 74 and 76, both of which are substantially identical in construction. Aperture 62 is shown in FIG. 7. It consists of a rectangular opening, one edge of which is semi-permanently established by plate 112 held by retaining members 114 and 116, each having a large number of flexible fingers which not only hold plate 112 against barrier 74 but also prevent its lateral movement.

As shown in FIG. 8, there is mounted on shaft 86 a door 66 whose edge 118, in the clockwise direction, increases in radial distance continuously from the axis of shaft 86. Door 66 fits snugly against barrier 74 as shown in FIG. 6. As the shaft rotates in the counter-clockwise direction as viewed in FIG. 8, the area of aperture 62 decreases. FIGS. 8 and 9 are consistent with each other with respect to the position of shaft 86. Therefore, it will be understood that the aperture decreases as the capacitance of capacitor 48 decreases.

As shown in FIG. 6, barrier 76 is also provided with a semi-permanent plate 120 and a door 68 operated by shaft 86.

The function of the construction just described in which the variable capacitors and aperture doors are operated together is to achieve a substantially constant 3dB bandwidth ($BW_{3dB}$) and a substantially constant insertion loss ($I_L$) throughout the tuning range of the filter. The tuning range can be as much as or possibly more than a full octave, and a typical filter might be tunable continuously from 200 to 400MHz. In order to achieve a balance between attenuation on the upper and lower sides of the pass band, the apertures are positioned at an intermediate location with respect to the inductors. This provides both capacitive and mutual inductive coupling between stages.

As mentioned previously, it is characteristic of electric wave filters to exhibit an increasing bandwidth $BW_{3dB}$ as the center frequency $f_o$ of the passband increases. This is because, for a given value of $Q_L$, the loaded Q of the filter, $$BW_{3dB} = f_o/Q_L . \quad (1)$$

It is also characteristic of electric wave filters that the insertion loss $I_L$ increases as $f_o$ decreases producing greater losses near the low frequency end of the tuning range. This is apparent from the following equation for insertion loss:

$$I_L = 20 \log \frac{Q_U/Q_L}{Q_U/Q_L - 1} \quad (2)$$

where $Q_U$ is the unloaded $Q$ of the filter related to the cavity volume V and to $f_o$ by $$Q_U = 50 \sqrt[3]{V} \sqrt{f_o} \quad (3)$$

By decreasing the coupling apertures as $f_o$ increases, $Q_L$, the loaded Q of the filter is increased. This tends to reduce the variation of the bandwidth $BW_{3dB}$ of the filter as $f_o$ is varied as can be seen from equation (1) above. The shape of the doors 66 and 68 are preferably derived empirically so that the ratio $f_o/Q_L$ is maintained substantially constant throughout the tuning range thereby maintaining a substantially constant bandwidth.

The fact that the $Q_L$ decreases with decreasing frequency also tends to reduce the variation of $I_L$ over the tuning range of the filter, as can be seen from equation (2). When the doors 66 and 122 are so shaped that $f_o/Q_L$ is substantially constant, $I_L$, for all practical purposes, also becomes substantially constant. Some variation in $I_L$, of course, will exist if $f_o/Q_L$ is constant.

Figure 2:
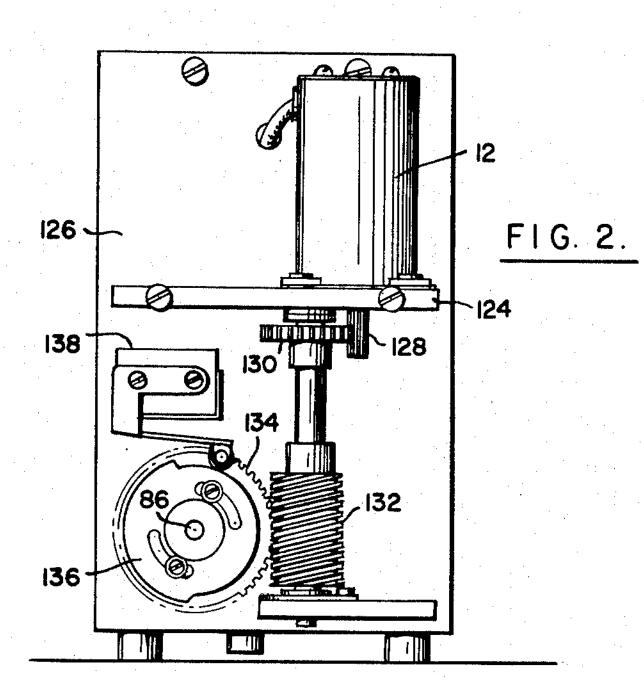
FIG. 2 is an elevation showing the principal mechanical parts of the tuning servomechanism.

FIG. 2 shows the mechanical aspects of the mechanism for driving tuning shaft 86. Reversible DC motor 12, which is mounted on bracket 124 at the end of filter housing 126 drives shaft 86 through a reducing gear train including gears 128 and 130, worm 132 and wheel 134. Wheel 134 is fixed to shaft 86. Also fixed on shaft 86 is cam 136 having approximately 180° of dwell during which it holds microswitch 138 in a closed condition. It is necessary that the apparatus be allowed to lock only in a particular 180° segment of its tuning range. The purpose of the cam and microswitch is to keep the motor running despite the circuit operation in order to prevent the apparatus from locking up on a frequency when the tuner is in the wrong part of its range.

Figure 5:
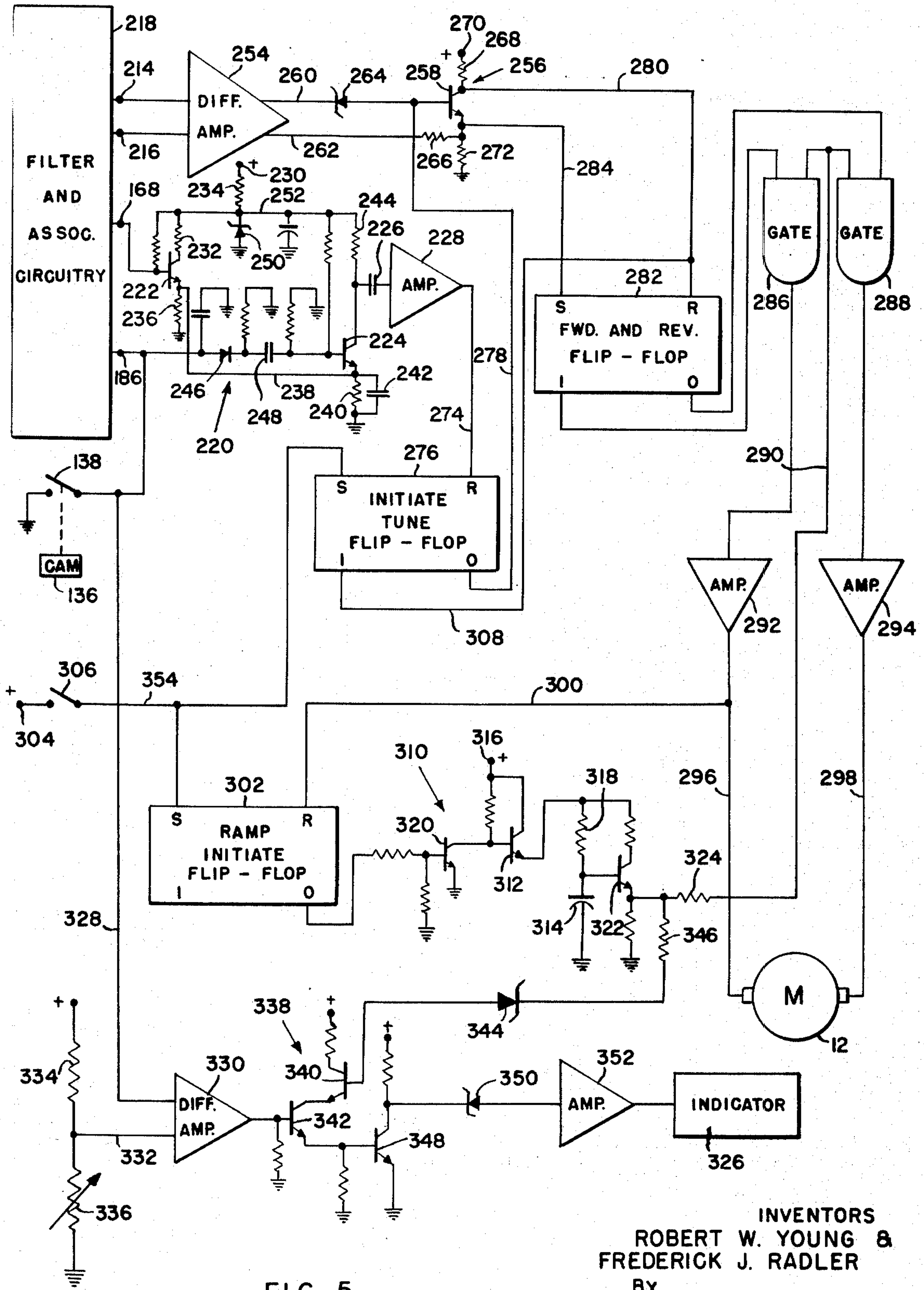
FIG. 5 is a schematic diagram illustrating circuitry of the tuning servomechanism.

FIG. 4 shows the filter and its associated electrical circuitry having four output terminals 214, 216, 168 and 186 which carry signals to the motor control circuitry of FIG. 5.

Coupler 14 includes a stripline 140 connecting line 142 to input loop 58. In close proximity to stripline 140 there are located strips 18 and 30 which pick up signals from stripline 140 for control of the tuning motor.

The physical construction of coupler 14 is shown more clearly in FIG. 3, which shows loop 58 connected at one end to U-shaped strip 140 and grounded at its other end. The other end of strip 140 is connected to line 142. Strip 30 parallels one leg of strip 140 while strip 18 parallels the other leg of strip 140. Coupling 14 is arranged directly underneath cavity 40 (FIG. 6) so that it makes a direct connection with loop 58 through floor 80 of the cavity. Coupling 14 not only acts as a coupling to provide motor control signals, but also acts as an impedance matching section between line 142 and input loop 58. In order to match properly, the characteristic impedance of the stripline should be made equal to the square root of the product of the impedances at line 142 and at the filter input.

Returning to FIG. 4, coupler 16 is similar in construction to coupler 14. It comprises a strip 148 which connects output loop 60 to line 150, and strips 38 and 26 which are parallel to strip 148. Coupler 16 is located underneath the floor of cavity 44 (FIG. 6). It matches the impedance at output loop 60 to the impedance of line 150, and also produces signals in strips 38 and 26 which are used for control of the tuning motor. The characteristic impedance of stripline 148 should be made equal to the square root of the product of the impedances of the filter output and line 150.

The coupling between stripline 140 and strips 18 and 30 is directional, and depends on the end of the pickup strip from which the signal is taken, the other end being terminated by a load resistor. Line 152 is connected to the end of strip 18 which is remote from input line 142, and the other end of strip 18 is connected through resistor 24 to ground. With this arrangement, strip 18 is sensitive to reflected power, and the signal in line 152 can be detected to produce a DC signal corresponding to power reflected by the filter. Line 152 is connected through transformer 154 to line 156 which is connected to ground through resistor 158. The signal in line 156 is rectified by diode 160 which connects line 156 to line 162. The cathode of diode 160 is connected to ground through resistor 164 and capacitor 166 and is connected to terminal 168 which, as a result, carries a DC signal the magnitude of which varies directly with power reflected by the filter.

Strip 26 in coupler 16 is connected at its end remote from output line 150 to line 170 the other end being connected through load resistor 172 to ground. The arrangement is such that the signal in line 170 varies directly with the forward transmitted power in coupling 16. Line 170 is connected through transformer 174 to line 176. Line 176 is grounded through resistor 178. Line 176 is also connected through diode 179 to line 180. Line 180 is connected to ground through resistor 182 and capacitor 184 in parallel and to terminal 186. Terminal 186 provides a DC signal the magnitude of which varies directly with forward power transmitted through the filter.

It will be understood that the signals at terminals 168 and 186 provide a coarse indication that the filter is tuned to the frequency of the input signal in line 142. When the filter is properly tuned, reflected power decreases, transmitted power simultaneously increases, and the signals at terminals 168 and 186 vary accordingly.

Strips 30 and 38 are so arranged as to produce signals respectively in lines 188 and 190 which correspond to power transmitted in the forward direction. Line 188 is connected through coaxial delay line 32 and through an attenuator 34 comprising resistors 194, 196 and 198 to primary winding 200 of transformer 202. Line 190 is connected directly to primary winding 204 of a similar transformer 206. A ring of four diodes is indicated at 208. The opposite ends of secondary windings 210 are connected to two opposite corners of the ring, and the opposite ends of secondary winding 212 are connected to the other two opposite corners of the ring. Both secondary windings are center-tapped, the center-taps being connected to output terminals 214 and 216 respectively, and by-passed to ground through capacitors 218 and 220.

Attenuator 34 compensates for the normal attenuation of the filter at resonance. Delay line 32 is designed to produce a phase shift, for any frequency in the tuning range of the filter, which is 90° less than the phase shift produced by the filter at resonance. The circuitry including transformers 202 and 206 and diode ring 208 compares the phase of the filter output signal with the phase of the delay line output to provide between terminals 214 and 216 a DC voltage which is zero when the phase difference across the phase detector is 90° and the polarity of which indicates whether the phase difference is greater or less than 90°. The polarity of the signal at terminals 214 and 216 indicates the direction in which the tuner shaft must be rotated for correction. Its amplitude increases, at least in a narrow frequency range, as the filter becomes further out of tune with the applied signal.

FIG. 5 shows the circuitry used for controlling the servomotor in response to the signals at terminals 168, 186, 214 and 216.

The filter and its associated circuitry (shown in FIG. 4) is indicated in FIG. 5 at 218 with output terminals 214, 216, 168 and 186.

Terminals 168 and 186 are connected to the respective inputs of an adding circuit (or AND gate) 220 comprising NPN transistors 222 and 224, the latter having its collector connected through capacitor 226 to amplifier 228. The collector of transistor 222 is connected to positive line 252 through resistor 232. Positive line 252 is in turn connected to positive supply terminal 230 through resistor 234. The emitter of transistor 222 is connected to ground through resistor 236. In addition, there is a connection through line 238 between the emitters of transistors 222 and 224, and an additional resistor 240 and capacitor 242 both in parallel with resistor 236 return the emitters to ground. The collector of transistor 224 is connected through resistor 244 to positive line 252. A Zener diode 250 is provided between positive line 252 and ground for regulation of the supply to transistors 222 and 224.

Terminal 168, the output terminal of the reflected power detection circuit (FIG. 4) is connected directly to the base of transistor 222. The forward power detector output at terminal 186 is connected through diode 246 and capacitor 248 to the base of transistor 224.

As noted previously, the circuit responds to a simultaneous decrease in reflected power, and an increase in filter output power as indicating a peak in the transmission of power from the input to the output of the filter and therefore a close approach to a tuned condition in the filter. Adding circuit 220 produces a pulse at the input of amplifier 228 when these conditions occur. Normally when the filter is out of tune, terminal 168 is at a high positive level maintaining transistor 222 in conduction and thereby maintaining the emitter of transistor 224 at such a high positive level that a positive increase in the voltage level at terminal 186 will not produce a sufficiently positive signal at the base of transistor 224 to cause transistor 224 to conduct. Consequently, if an increase in transmitted power occurs without a simultaneous reduction in reflected power, or vice-versa, no pulse will be produced at the input of amplifier 228.

The phase detector outputs at terminals 214 and 216 are delivered to the respective inputs of differential amplifier 254. An "inhibit" gate 256 comprising NPN transistor 258 receives both outputs 260 and 262 of the differential amplifier. Output 260 is connected to the base of transistor 258 through Zener diode 264. Output 262 is connected through resistor 266 to the emitter of transistor 258. The collector is connected through resistor 268 to positive terminal 270 and the emitter is connected through resistor 272 to ground.

The function of gate 256 is to put motor 12 under control of the phase detector only after a close approach to a tuned condition of the filter is indicated by an output pulse from amplifier 228. To this end the output of amplifier 228 is connected through line 274 to the resetting input of an "initiate tune" flip flop 276. The "0" output of flip flop 276 is connected through line 278 to the base of transistor 258. This holds transistor 258 in a cut off condition when flip flop 276 is set, the "0" output being negative.

The collector of transistor 258 is connected through line 280 to the resetting input of a "forward and reverse" flip flop 282. The emitter of transistor 258 is connected through line 284 to the "set" input of flip flop 282. The "1" and "0" outputs are connected respectively to gates 286 and 288, each of which comprises a conventional series power regulator. Line 290 is connected to inputs of both gates, and delivers a ramp signal to gates 286 and 288 for damping the motor as it hunts under the control of flip flop 282 so that it comes to a stop. Motor 12 is controlled through motor drive amplifiers 292 and 294. Amplifier 292 receives its input from gate 286 and delivers its output through line 296 to the motor. Similarly, amplifier 294 receives its input from gate 288, and delivers its output through line 298 to the motor. The output of amplifier 292 is also delivered through line 300 to the resetting input of a "ramp initiate" flip flop 302. Positive terminal 304 is connected through a switch 306 to the " set" inputs of flip flops 276 and 302. The "1" output of flip flop 276 is connected through line 308 to the resetting input of flip flop 282.

Switch 138 (also shown in FIG. 2) is connected between terminal 186 and ground. Cam 136 is arranged so that terminal 186 is grounded throughout the half of the tuning range in which it is desired not to allow the tuning shaft to come to a stop. A ramp generator is indicated at 310. It receives its input from the "0" output of flip flop 302, and delivers its output to line 290. Transistor 312 is arranged to control charging of capacitor 314 from positive terminal 316 through resistor 318. Transistor 312 is controlled by the "0" output of flip flop 302 through an amplifier comprising transistor 320. Capacitor 314 is connected between ground and the base of transistor 322 whereby the voltage level at the emitter of transistor 322 varies with the charge on the capacitor. The emitter of transistor 322 is connected through resistor 324 to line 290.

An indicator 326, which may be an indicator lamp, is controlled by the signal at terminal 186 and the signal at the output of ramp generator 310. Terminal 186 is connected through line 328 to an input of differential amplifier 330. The other input is derived through line 332 from a dropping network comprising fixed resistor 334 and variable resistor 336 connected in series between a positive terminal and ground. An adding circuit (or AND gate) is indicated at 338. It comprises NPN transistors 340 and 342 connected with their emitter-collector circuits in series. The base of transistor 342 is connected to the output of amplifier 330. The base of transistor 340 is connected through Zener diode 344 and resistor 346 to the emitter of transistor 322 of the ramp generator. The emitter of transistor 342 is connected to the base of NPN transistor 348 the collector of which is connected through Zener diode 350 to the input of amplifier 352 which controls indicator 326.

Switch 306 is a manually operated control switch which, when closed, delivers a command pulse to line 354. (The command pulse, of course, can be generated by alternative means.) The command pulse sets flip flops 276 and 302 simultaneously. Flip flop 276 resets flip flop 282 through line 308, and this resetting insures that motor 12 will always run initially in a particular direction following the initiation of operation by the command pulse. Flip flop 276, when set, also inhibits the phase detector by cutting off transistor 258 in gate 256. Flip flop 302, upon being set, disables ramp generator 310. The output of the ramp generator in line 290, is at a level when the ramp generator is disabled such that gates 286 and 288 are enabled, thereby allowing the motor to be driven by either of amplifiers 292 and 294, depending on the condition of flip flop 282.

Since flip-flop 282 is reset at this time, gate 288 is operative, and the motor is driven by amplifier 294. The motor continues to run in its initial direction until a simultaneous decrease in reflected power and increase in filter output power is sensed by the forward and reflected power level detectors indicating that the filter is approaching a tuned condition with respect to the signal at its input. Amplifier 228 delivers a pulse to the resetting input of flip flop 276. The "0" output of flip flop 276 swings positive at this time, enabling gate 256. At this time, the motor comes under the control of the phase detector.

The resetting of flip flop 276 also sets flip flop 282 through transistor 258. This reverses the motor, by causing the motor to be operated through amplifier 292. The reversing of the motor slows the motor down so that it can be controlled effectively by the phase detector to oscillate back and forth in a narrow part of the tuning range. The output of amplifier 292 resets flip flop 302 through line 300. At this time the ramp generator capacitor 314 begins to charge.

When the filter is tuned either above or below the applied signal the output polarity of the phase detector at terminals 214 and 216 is such that the motor is driven in a direction tending to move the center frequency of the passband toward the frequency of the applied signal. Because of inertia of the motor and its gear train the mechanism tends to overshoot the desired tuning point, and hunts back and forth across the zero point. As the mechanism is hunting, the output of the ramp generator in line 290 continuously increases in a positive direction and eventually disables gates 286 and 288. The result is that the motor tends to come to a graduated stop very near the point on which the center frequency of the passband coincides with the frequency of the applied signal.

A lockup on frequency is indicated by indicator 326. The output of amplifier 330 increases when the signal in line 328 exceeds the adjustable reference level in line 332. When this condition exists at the output of the differential amplifier 330 and simultaneously the output of the ramp generator is more than sufficient to disable the motor, indicator 326 is operated.

The fact that the adjustable inter-stage coupling of the filter provides for reduced bandwidth and insertion loss variations enables the tuning control servomechanism to operate in a substantially uniform manner irrespective of the frequency of the applied signal.

The filter in accordance with the invention very effectively eliminates broad-band noise radiation in RF transmitting apparatus without introducing significant losses and without introducing a need for an additional control by the operator. While it is primarily useful in communication transmitters, it may be used also in receiving apparatus and in other equipment such as radar, distance measuring or direction finding equipment.

We claim:

1. An electric wave filter comprising:

a plurality of resonant stages each passing signals at or near a desired resonant frequency, but attenuating signals at other frequencies, tuning means for each of said resonant stages, said tuning means being interconnected and synchronized so that all of said resonant stages are tuned simultaneously to substantially the same resonant frequency, means electrically coupling said resonant stages to provide a multiple-stage filter, said coupling means being adjustable, and means responsive to the condition of said tuning means for adjusting said coupling means whereby, as the resonant frequency of said stages increases, the coupling between said stages decreases to an extent providing a substantially constant bandwidth over the tuning range.

2. An electric wave filter comprising:

a plurality of resonant stages, means coupling said resonant stages to provide a multiple-stage band-pass filter, said coupling means being adjustable, means for tuning said multiple-stage band-pass filter to adjust its center frequency through a tuning range, and means responsive to the condition of said tuning means for adjusting said coupling means whereby, as the center frequency of said pass band increases, the coupling between said stages decreases to an extent providing a substantially constant bandwidth over the tuning range.

3. An electric wave filter comprising:

a plurality of resonant stages, means coupling said resonant stages to provide a multiple-stage band-pass filter, said coupling means being adjustable, means for tuning said multiple-stage band-pass filter to adjust its center frequency through a tuning range, and means responsive to the condition of said tuning means for adjusting said coupling means whereby, as the center frequency of said pass band increases, the coupling between said stages decreases, thereby providing a reduction in the variation of bandwidth over the tuning range.

4. An electric wave filter according to claim 3, in which said resonant stages are cavities, each adjustable by said tuning means and in which said coupling means comprises means providing variable interstage apertures adjustable by said means responsive to the condition of said tuning means.

5. An electric wave filter according to claim 3, in which said resonant stages are cavities, each containing an inductor and a variable capacitor connected in shunt with said inductor; each said capacitor being adjustable by said tuning means; and in which said coupling means comprises means providing inter-stage apertures including door means for each of said apertures operated by said means responsive to the condition of said tuning means to adjust the areas of the apertures as said tuning means is adjusted.

6. An electric wave filter according to claim 3, in which said resonant stages are cavities, each containing an inductor and a variable capacitor connected in shunt with said inductor; in which the variable capacitors are connected to be adjusted through a common rotatable shaft by said tuning means; and in which said coupling means comprises means providing inter-stage apertures including door means for each of said apertures operated by said shaft to adjust the areas of the apertures as said shaft is rotated.

7. An electric wave filter according to claim 3, in which said means for tuning said multiple-stage band-pass filter comprises mechanically adjustable resonant means.

8. An electric wave filter according to claim 3 in which the means for tuning the filter comprises a motor, and means responsive to the phase shift across the filter for controlling the motor whereby the motor comes to a stop when the phase shift corresponds to the tuning of the center frequency of the filter pass-band to the frequency of the signal at the filter input, said means responsive to the phase shift across the filter including means compensating for variations in the phase shift across the filter at resonance which are dependent on the frequency to which the filter is tuned.

9. An electric wave filter according to claim 8 in which the means responsive to the phase shift across the filter comprises phase-sensitive detecting means coupled to the input and output of the filter and producing an output which varies in accordance with the phase shift across the filter and in which the compensation means comprises a delay line connected between the detecting means and the filter input.

10. An electric wave filter comprising:

a plurality of resonant stages, means coupling said resonant stages to provide a multiple-stage band-pass filter, said coupling means being adjustable, means for tuning said multiple-stage band-pass filter to adjust its center frequency through a tuning range, means responsive to the condition of said tuning means for adjusting said coupling means whereby, as the center frequency of said pass band increases, the coupling between said stages decreases, thereby providing a reduction in the variation of bandwidth over the tuning range, and means responsive to the signals at the input and output of said filter for effecting operation of said tuning means whereby said tuning means is adjusted to a condition in which the center frequency of the filter pass-band corresponds to the frequency of the signal at the filter input.

11. In combination:

a band-pass filter having an input and an output, and having an adjustable pass band center frequency, and means for adjusting the pass band center frequency, said adjusting means comprising a motor, and means responsive to the phase shift across said filter for controlling said motor whereby said motor comes to a stop when said phase shift across the filter corresponds to tuning of the center frequency of the filter pass band to the frequency of the signal of the filter input, said means responsive to the phase shift across the filter including means compensating for variations in the phase shift across the filter at resonance which are dependent on the center frequency to which the filter is tuned.

12. The combination according to claim 11 in which said means responsive to the phase shift across said filter comprises phase-sensitive detecting means coupled to said input and said output and producing an output which varies in accordance with the phase shift across the filter and in which said compensating means comprises a delay line connected between said phase-sensitive detecting means and the input of said filter.

13. In combination:

a band-pass filter having an input and an output and having an adjustable pass band center frequency, means for sensing a peak in the transmission of power by said filter from said input to said output comprising means for sensing a decrease in reflected power at the input of said filter and a simultaneous increase in transmitted power at the output of said filter, and means for adjusting the pass-band center frequency of the filter, said adjusting means comprising a motor, means operating said motor for scanning the tuning range and means responsive to said sensing means for bringing said motor to a stop when the sensing means senses a peak in the transmission of power by said filter.

14. In combination:

a band-pass filter having an input and an output and having an adjustable pass band center frequency, means for sensing a peak in the transmission of power by said filter from said input to said output, comprising means for sensing a decrease in reflected power at the input of said filter and a simultaneous increase in transmitted power at the output of said filter, means responsive to the phase shift across said filter and providing a control signal, and means for adjusting the pass-band center frequency of the filter, said adjusting means comprising a motor, means operating said motor for scanning the tuning range, and means responsive to said sensing means for effecting, when a peak is sensed, control of said motor in response to said control signal whereby said motor comes to a stop when said phase shift across the filter corresponds to tuning of the center frequency of the filter pass-band to the frequency of the signal at the filter input.

* * * * *